United States Patent
Koh et al.

(10) Patent No.: US 6,950,490 B1
(45) Date of Patent: Sep. 27, 2005

(54) FAULT STATE DETECTION MECHANISM FOR A RING-COUNTER-BASED FREQUENCY DIVIDER-BY-N THAT GENERATES NON-OVERLAPPING N-PHASES OF DIVIDE-BY-N CLOCKS WITH 1/N DUTY RATIO

(75) Inventors: Yongseon Koh, Palo Alto, CA (US); Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 67 days.

(21) Appl. No.: 10/751,673

(22) Filed: Jan. 5, 2004

(51) Int. Cl.$^7$ ............................................. H03K 23/54
(52) U.S. Cl. .......................... 377/46; 377/16; 377/28; 377/29; 377/122
(58) Field of Search ................. 377/16, 28, 29, 377/46, 122

(56) References Cited

U.S. PATENT DOCUMENTS 5,550,528 A * 8/1996 Offord et al. ............ 340/146.2
6,826,250 B2 * 11/2004 Groo ............................ 377/47

* cited by examiner

*Primary Examiner*—Margaret R. Wambach

(57) ABSTRACT

A fault state detector for a ring counter is formed from unit current sources each switched under the control of a different one of the outputs of the ring counter. The currents switched in that manner are passed through a unit resistance to generate a voltage signal proportional to the number of asserted outputs from the ring counter. The voltage signal is compared to boundary reference values for valid states of the ring counter outputs and, if the voltage signal is not between the boundary reference values, a fault state is indicated.

20 Claims, 10 Drawing Sheets

FAULT STATE DETECTION MECHANISM FOR A RING-COUNTER-BASED FREQUENCY DIVIDER-BY-N THAT GENERATES NON-OVERLAPPING N-PHASES OF DIVIDE-BY-N CLOCKS WITH 1/N DUTY RATIO

TECHNICAL FIELD OF THE INVENTION

The subject matter of this application is related to the subject matter disclosed in commonly assigned, co-pending U.S. patent application Ser. No. 10/751,674 entitled "METHOD FOR GENERATING NON-OVERLAPPING N-PHASES OF DIVIDE-BY-N CLOCKS WITH PRECISE 1/N DUTY RATIO USING A SHIFT REGISTER" and filed on an even date herewith, the subject matter of which is incorporated by reference herein.

TECHNICAL FIELD OF THE INVENTION

The present invention is directed, in general, to clock frequency dividers and, more specifically, to fault state detection for a ring counter in a clock frequency divider employed in dividing a clock signal into N signals each with a 1/N duty ratio and non-overlapping asserted phases.

BACKGROUND OF THE INVENTION

N phases of divide-by-N clocks with a 1/N duty ratio may be utilized to serialize N bits of parallel data into a serial data stream using a multiplexer. One method of generating N phases of divide-by-N clocks with a 1/N duty ratio is to use an N-bit ring counter, illustrated for a divide-by-5 implementation in FIG. 4. The 5-bit ring counter 500 is implemented by a series of five flip-flops with synchronous preset and reset. Upon reset, one of the flip-flops is synchronously preset (the first flip-flop in the series, in the example shown) and the remaining flip-flops are synchronously reset, thereby generating a token of a single "1". This token is passed around the ring indefinitely, yielding 5 phases of divide-by-5 clocks each with a 1/5 duty ratio.

One disadvantage of this method is that when the invalid or fault states occur, the fault states are also passed around the ring indefinitely, such that invalid state detection is required. Fault states can be classified into two types: all zeros and multiple ones. Fault states due to multiple ones may be further classified into two types: two consecutive ones (e.g., 11XXX, where "X" stands for "don't care") and one followed by another one with delay (e.g., 1X1XX). The 5 valid states and 27 invalid states for a divide-by-5 clock frequency divider with 1/5 duty ratio are illustrated in FIGS. 5A and 5B, respectively. Accordingly, combinational logic gates may be used for fault state detection, with three combinational AND gates and an OR gate used to detect all three cases and flag a fault state, as illustrated in FIG. 6.

The drawback to combinational logic fault state detection is that the circuitry typically introduces large and unbalanced load capacitances, which in turn may cause the phases to overlap and the duty ratio to deviate from 1/N at high operating frequencies.

There is, therefore, a need in the art for improved fault state detection in a clock frequency divider based on a ring counter.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
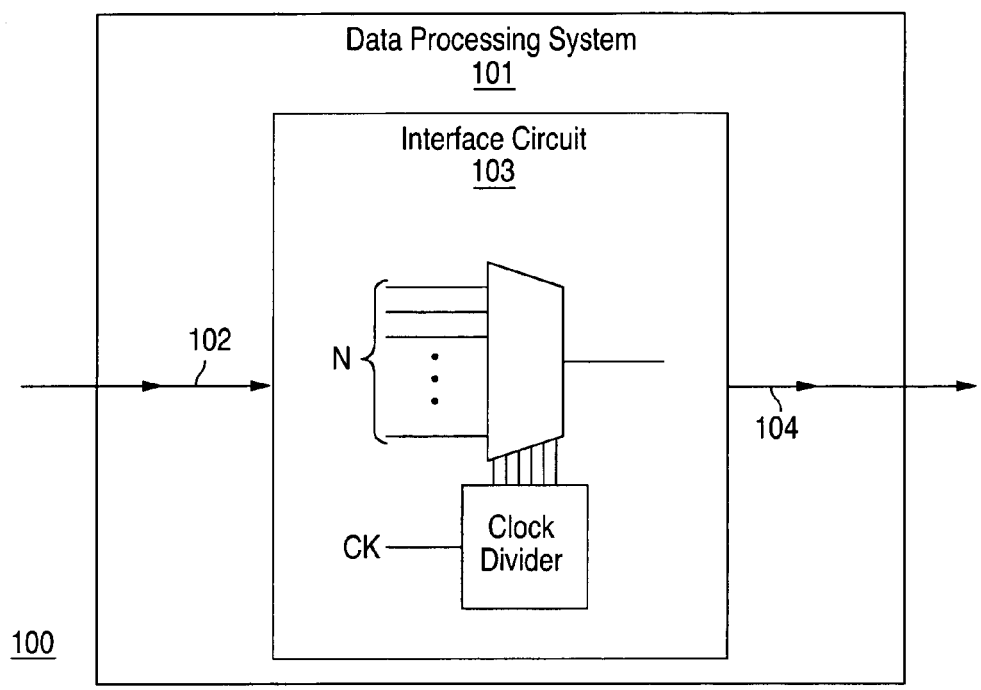
FIG. 1 depicts a communications system including a clock frequency divider having fault state detection according to one embodiment of the present invention.
Figure 4:
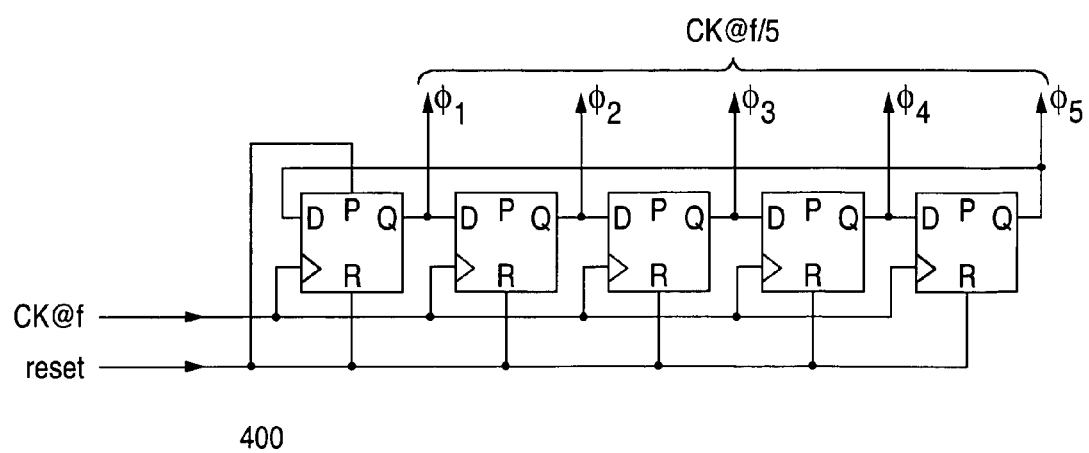
FIG. 4 depicts a ring-counter based divide-by-5 clock frequency divider that may be employed within one embodiment of the present invention.

To address the above-discussed deficiencies of the prior art, it is a primary object of the present invention to provide, for use in a serializing circuit for a communications system, a fault state detector for a ring counter that is formed from unit current sources each switched under the control of a different one of the outputs of the ring counter. The currents switched in that manner are passed through a unit resistance to generate a voltage signal proportional to the number of asserted outputs from the ring counter. The voltage signal is compared to boundary reference values for valid states of the ring counter outputs and, if the voltage signal is not between the boundary reference values, a fault state is indicated.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the detailed description below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller might be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

FIGS. 1 through 4, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a communications system including a clock frequency divider having fault state detection according to one embodiment of the present invention. Communications system 100 includes at least a data processing system 101, which may be, for example, a computer (desktop or laptop), a mobile telephone, a wireless personal digital assistant (PDA) or other device. The data processing system 101 includes an input 102 to an interface circuit 103 in which N parallel data signals are serialized to an output 104 by a multiplexer under the control of a clock divider operating on a clock signal CK. Either or both of inputs 102 and 104 may optionally receive or transmit signal(s) external to data processing system 101, and clock CK may be received from an external source of generated internally within either data processing system 101 or interface circuit 103.

Those skilled in the art will recognize that the full construction and operation of a communications system is not depicted or described herein. Instead, for simplicity and clarity only so much of the construction and operation of a communications system as is unique to the present invention or necessary for understanding the present invention is depicted and described.

Figure 2A:
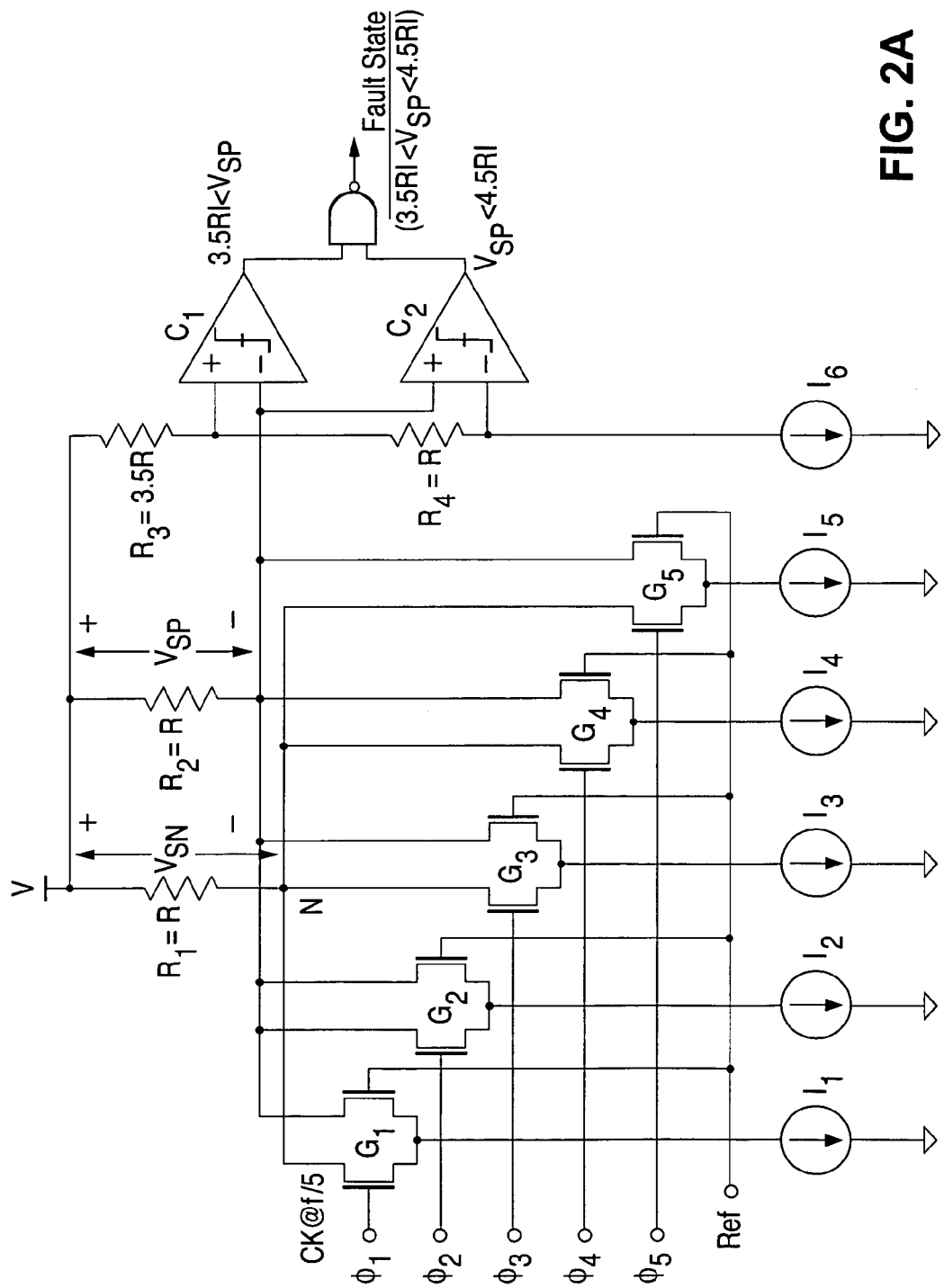
FIGS. 2A–2B illustrate single ended and differential implementations, respectively, of a fault state detector for a ring counter within a clock frequency divider according to one embodiment of the present invention.
Figure 2B:
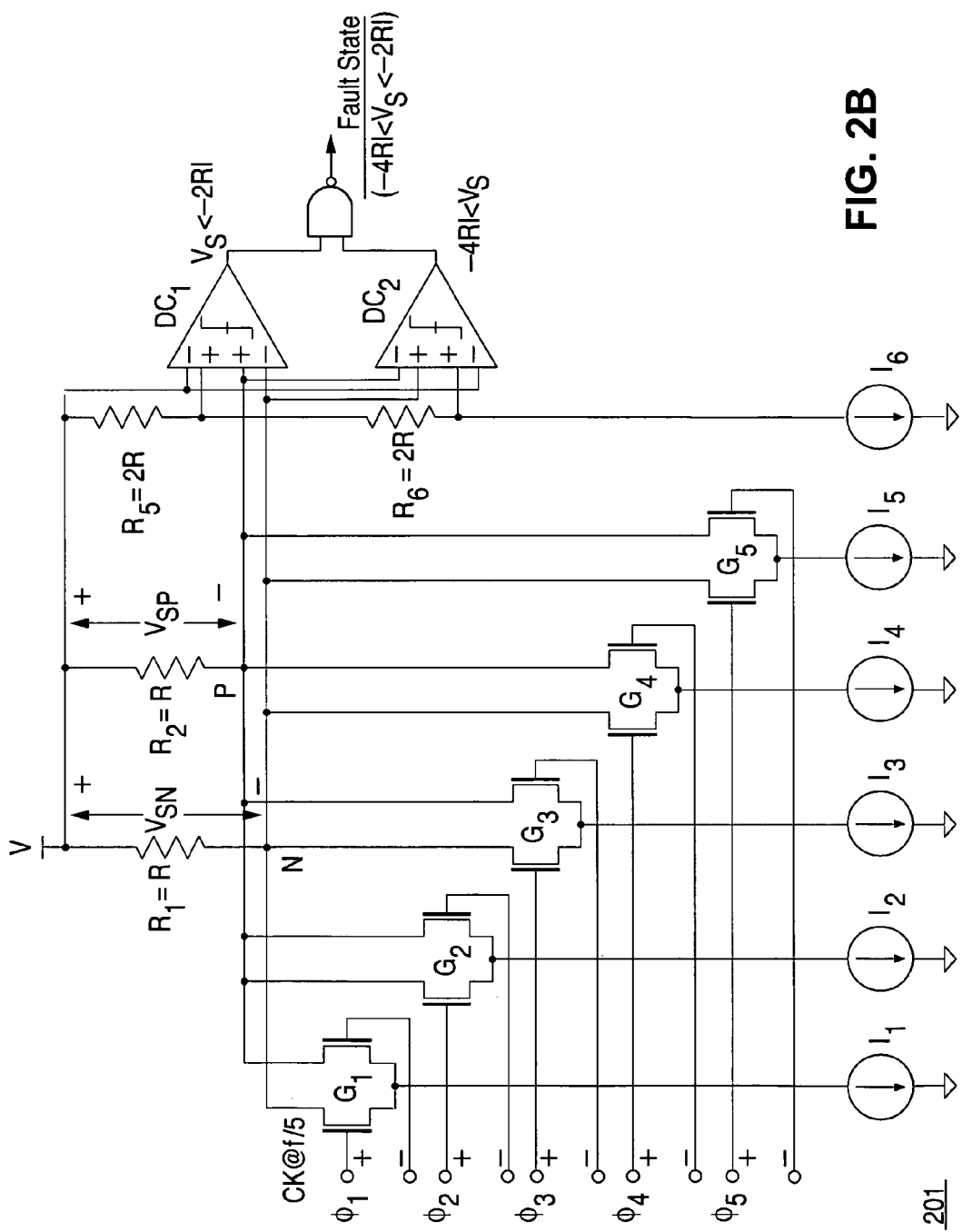
Figure 3A:
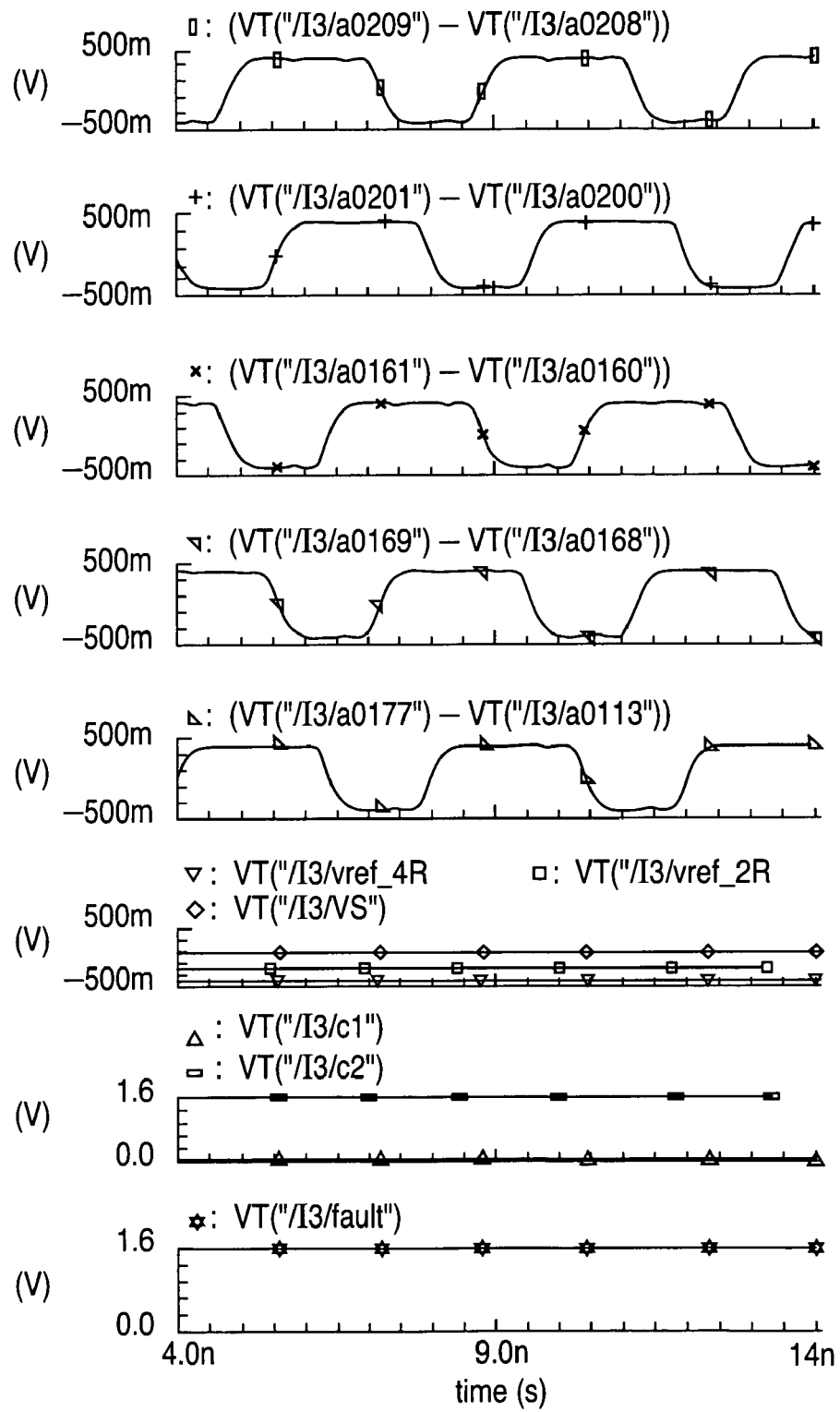
FIGS. 3A–3F depict transient simulations for a differential fault detector in a divide-by-5 clock ring counter-based frequency divider according to one embodiment of the present invention.
Figure 3B:
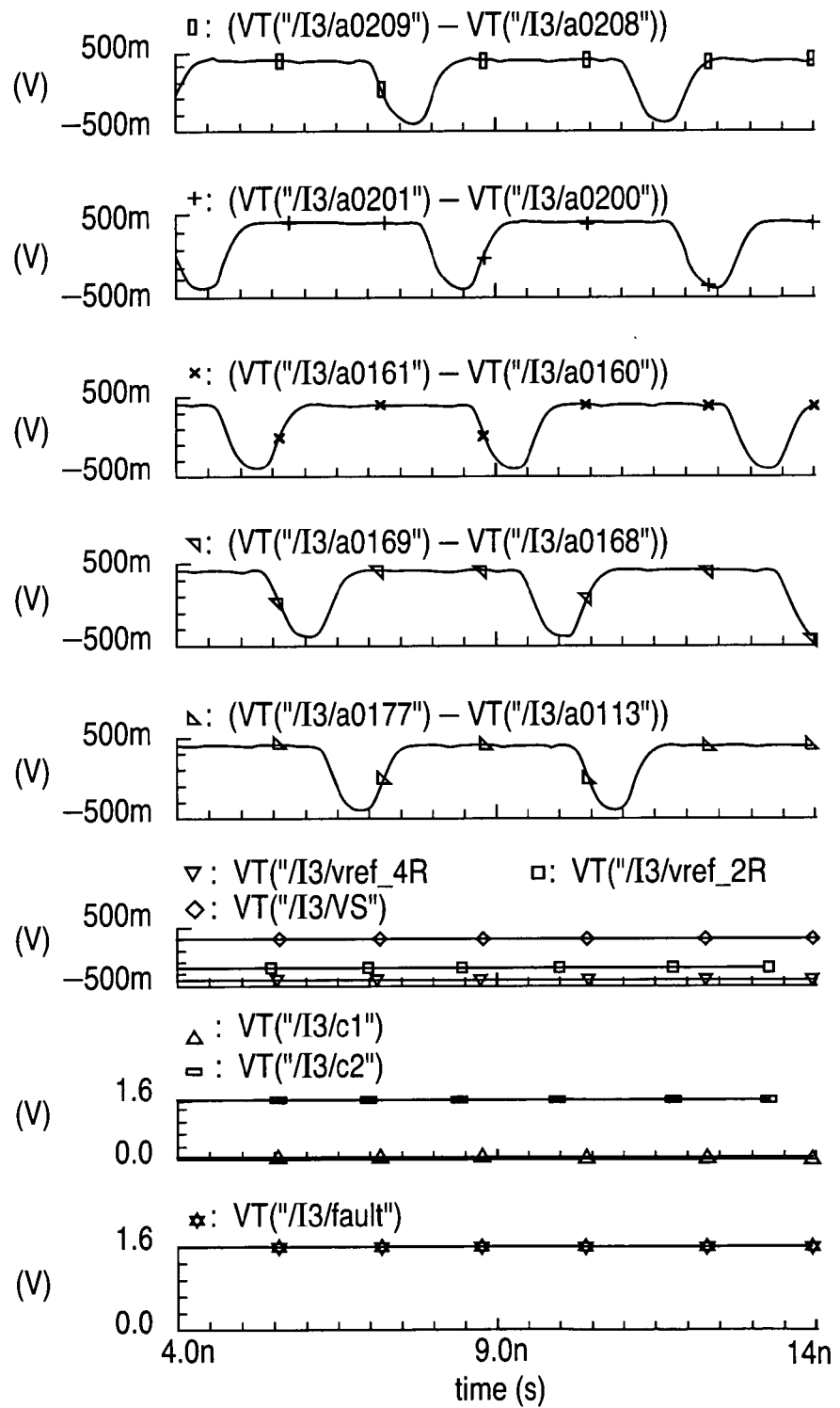
Figure 3C:
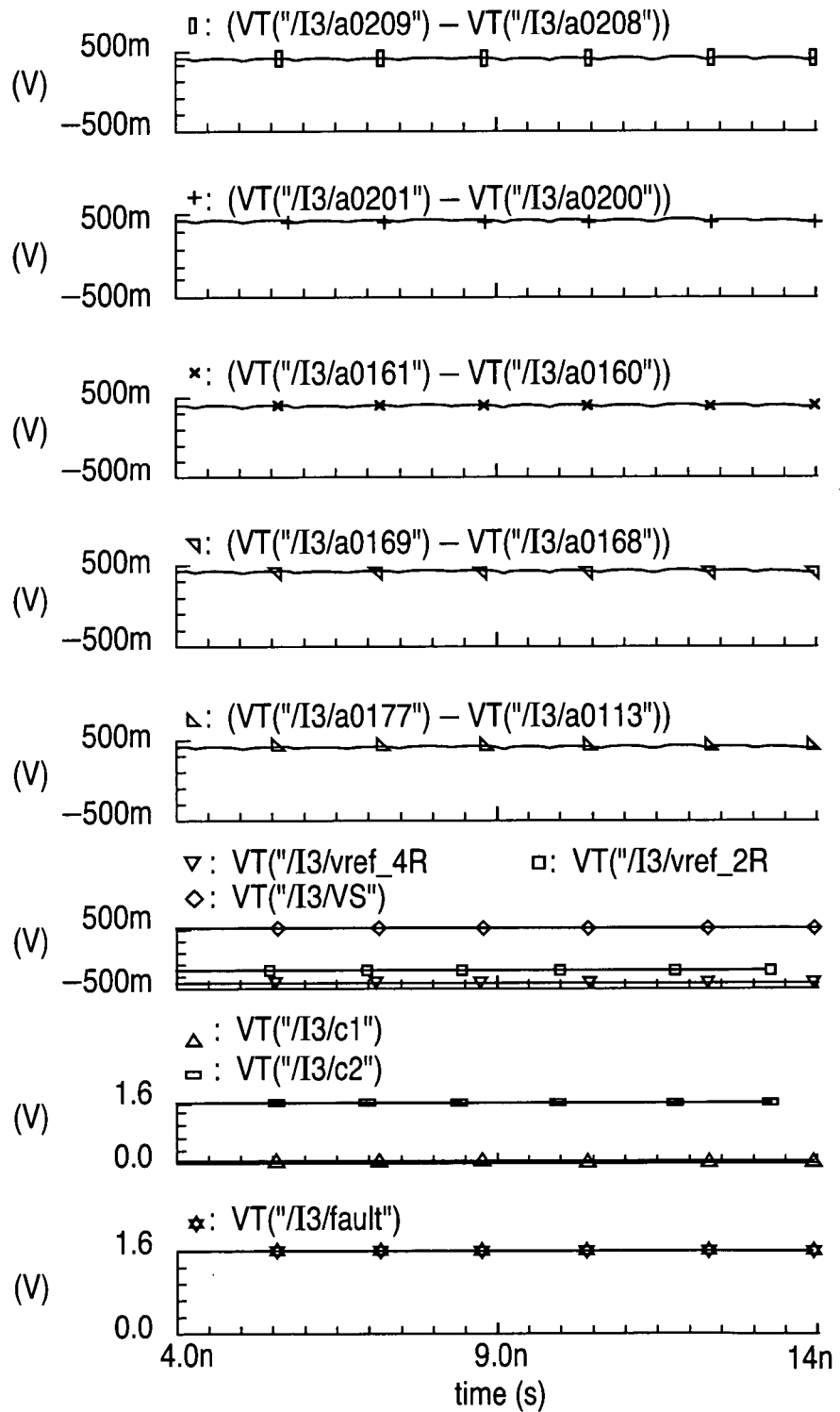
Figure 3D:
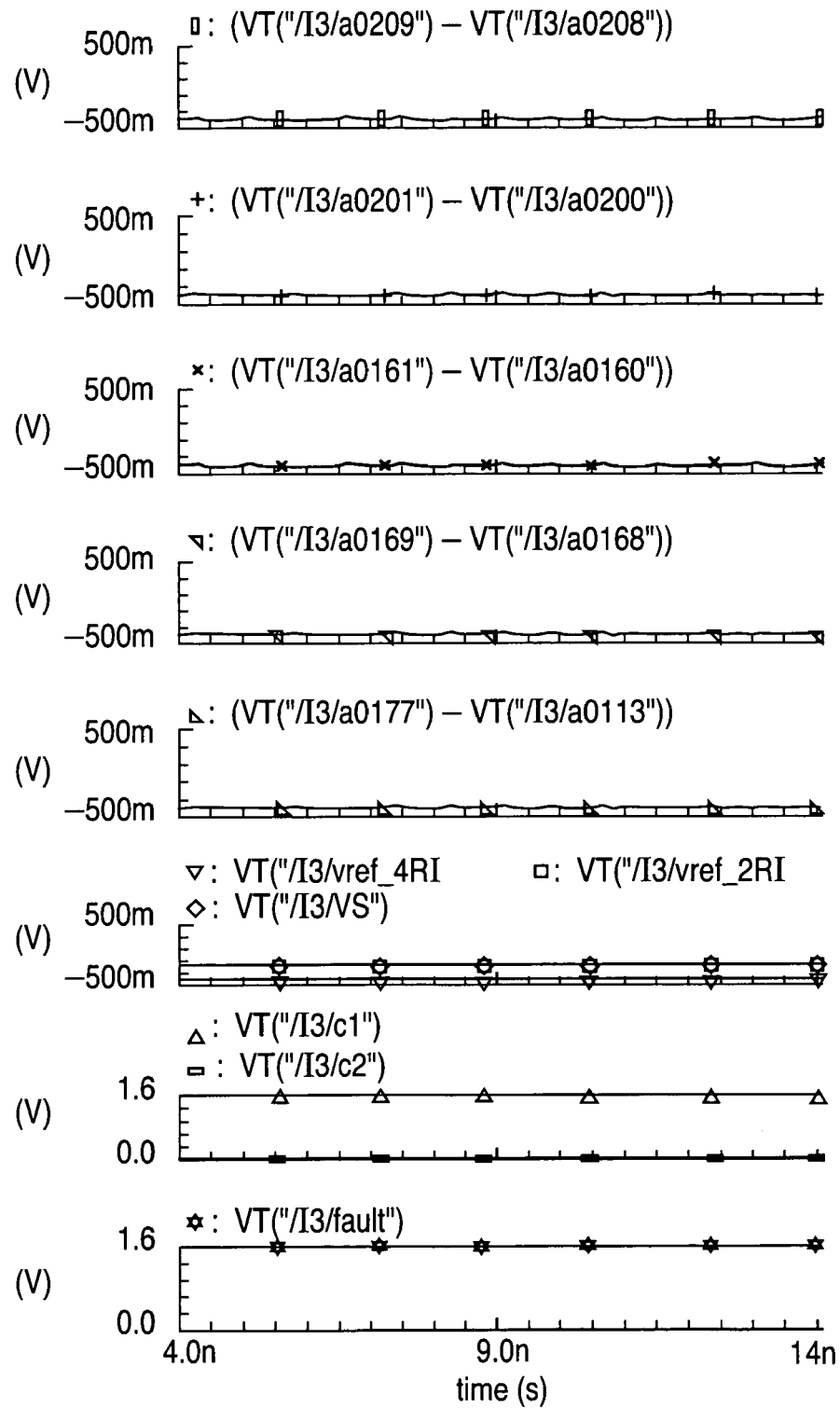
Figure 3E:
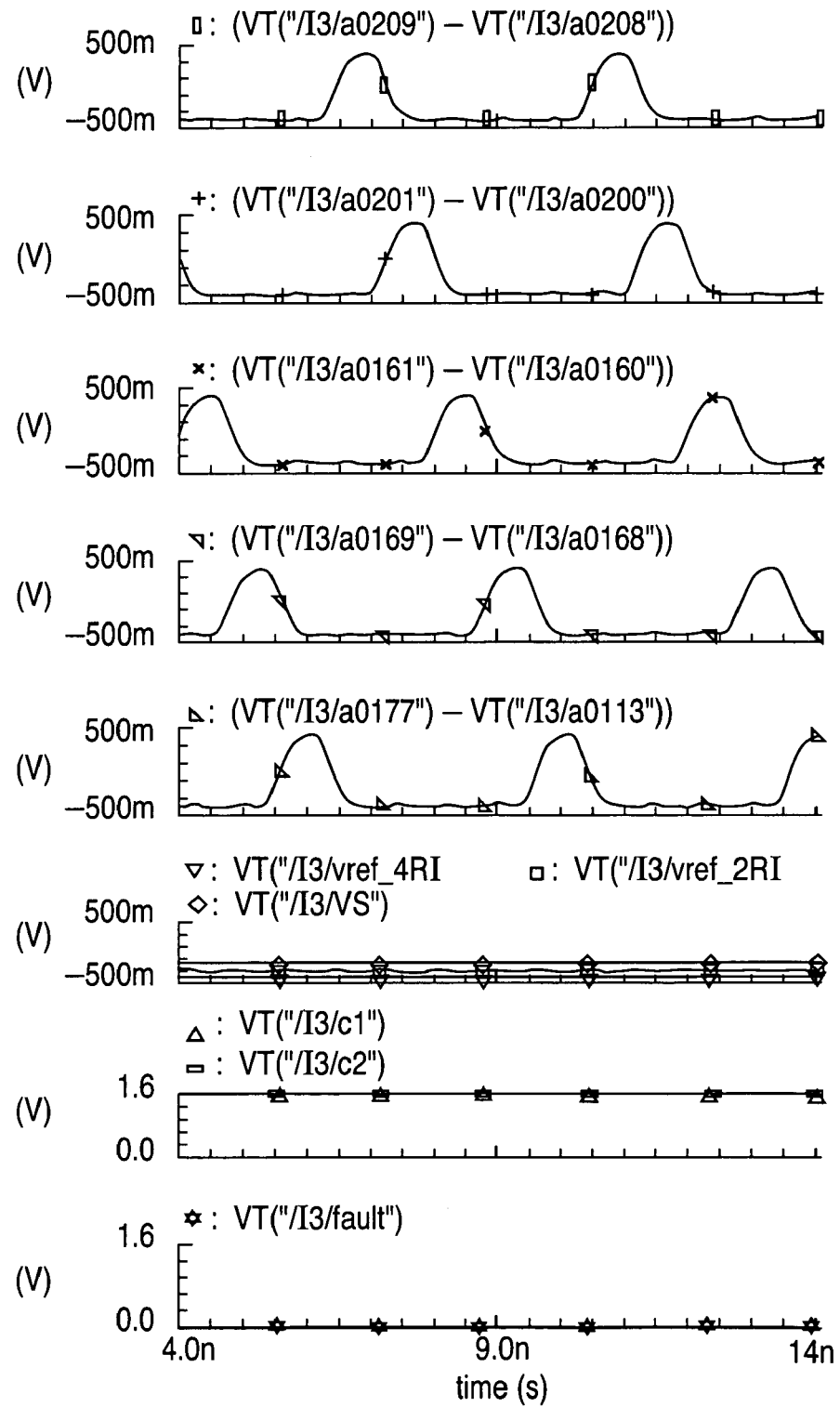
Figure 3F:
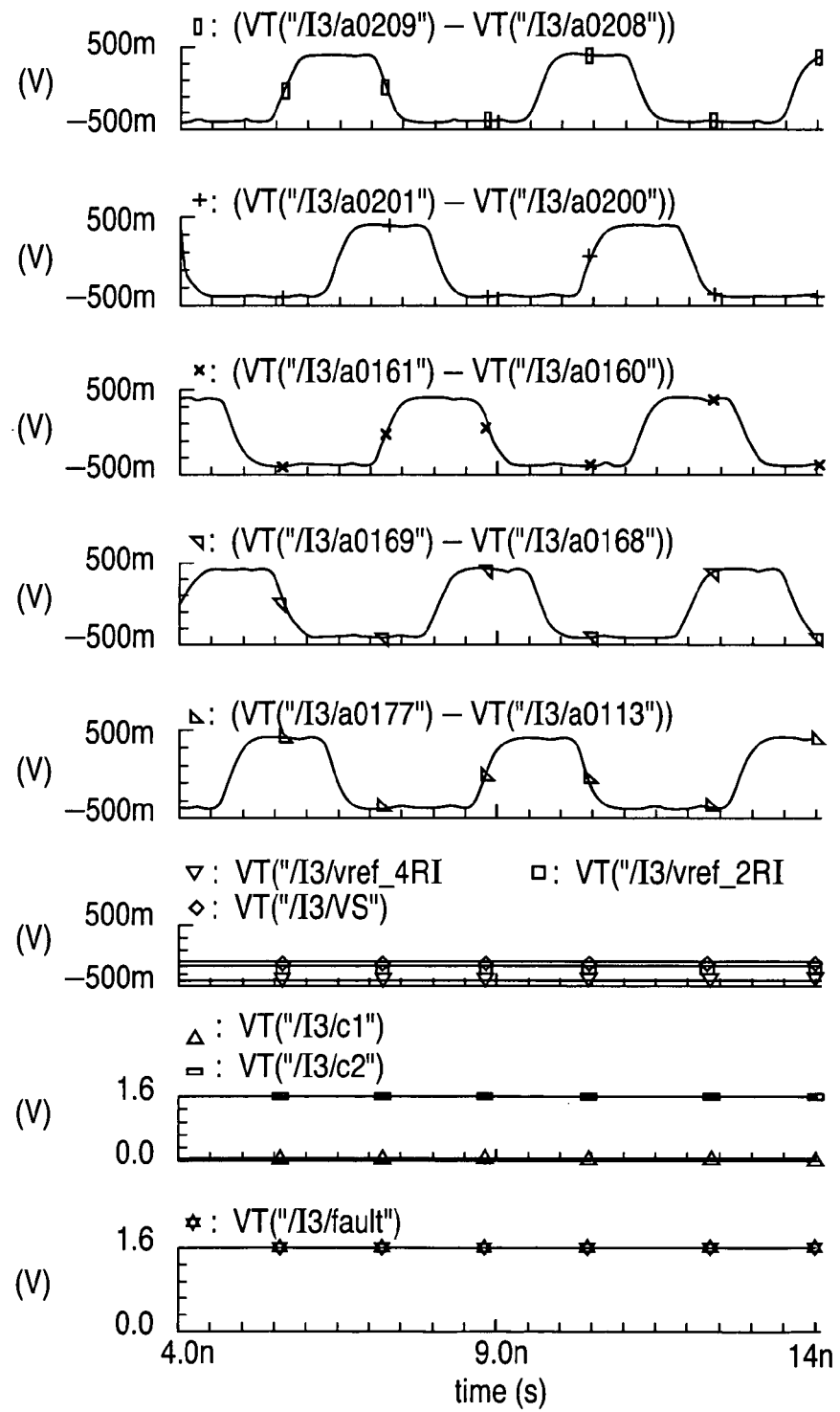
Figure 5A:
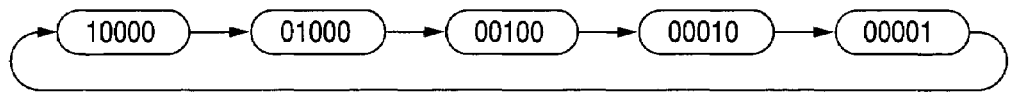
FIGS. 5A–5B depict valid and invalid states, respectively, for a ring counter employed as a non-overlapping N phase, 1/N duty ratio clock frequency divider.
Figure 5B:
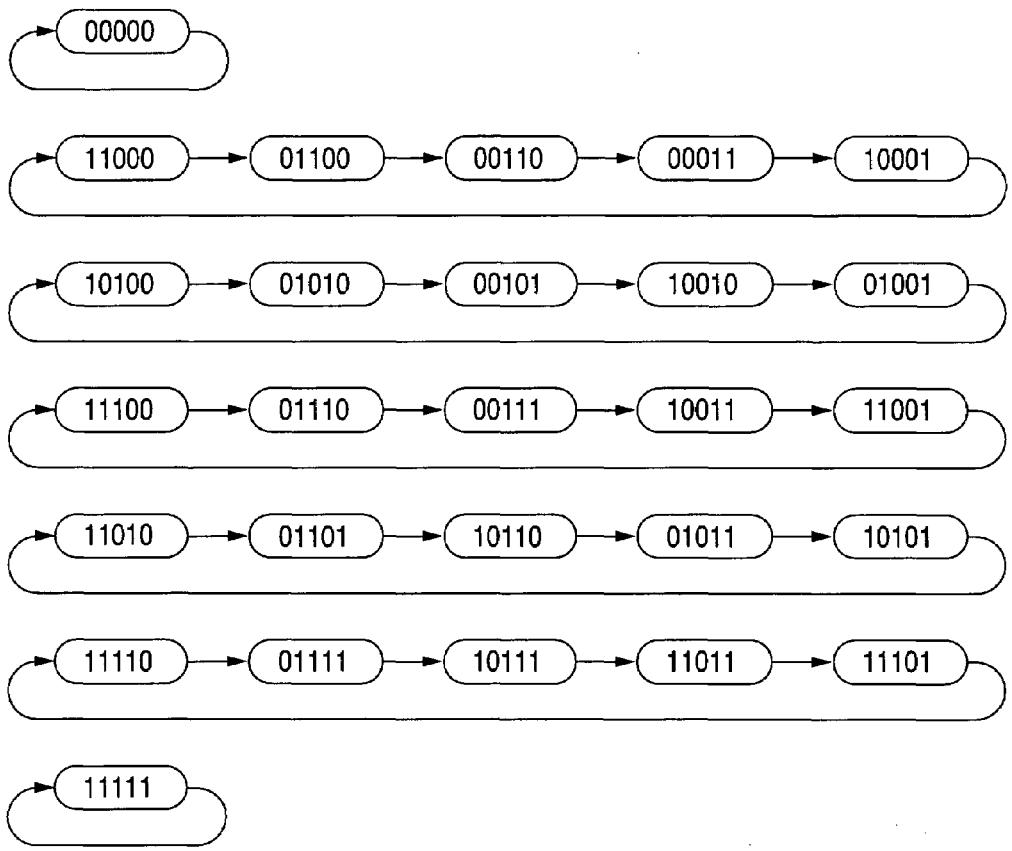
Figure 6:
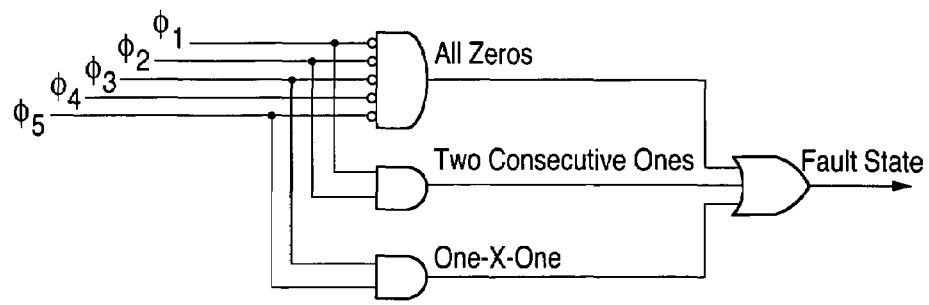
FIG. 6 depicts one possible combinational logic fault detector for use with a ring counter employed as a non-overlapping N phase, 1/N duty ratio clock frequency divider.

FIGS. 2A and 2B illustrate single ended and differential implementations, respectively, of a fault state detector for a ring counter within a clock frequency divider according to one embodiment of the present invention. Fault state detectors 200 and 201 are each implemented within interface circuit 103 together with a 5-bit ring counter 400 with synchronous preset and reset to form a divide-by-5 clock frequency divider.

In the present invention, fault state detection for a ring counter-based divide-by-N clock frequency divider is based on the observation that the ring counter only has valid states when the number of 1's in the ring is, at any given time, exactly one. In that circumstance, a single pulse with duty ratio 1/N is generated from the N outputs of the ring counter. When the number of 1's becomes zero or two or larger, the ring has fallen into one of the fault states.

The average direct current (DC) voltage of the outputs from the ring counter is directly proportional to the number of 1's in the ring. Accordingly, in the present invention the average DC voltage from the ring counter outputs is obtained and checked for correspondence to the DC voltage representing exactly one single 1 within the ring. The average DC voltage is obtained by converting the logic high voltages into unit currents, summing the units currents (if any), and dumping the currents into a load resistor. Two comparators compare the average DC voltage with two boundary voltages that represent a single 1 within the ring for the DC value check. A fault state is flagged if the DC voltage is not between the two boundary voltages.

Single ended, rail-to-rail logic fault state detector 200 is implemented by a set of source-coupled differential pairs $G_1$–$G_5$. Each differential pair $G_1$–$G_5$ receives a different one of the five rail-to-rail single-ended output clocks $\Phi_1$–$\Phi_5$ (each operating at one-fifth the frequency f of clock signal CK and with a 1/5 duty ratio) from ring counter 400 at one control input and a reference voltage Ref at the other control input, where the reference voltage Ref is an average of the two supply rails. Each differential pair $G_1$–$G_5$ is configured, and the reference voltage Ref selected, so that when a given clock signal $\Phi_1$–$\Phi_5$ is a 1, the current through the respective differential pair $G_1$–$G_5$ passes through a left hand branch, while the current through the respective differential pair $G_1$–$G_5$ passes through a right hand branch when a given clock signal $\Phi_1$–$\Phi_5$ is a 0.

The coupled output of each differential pair $G_1$–$G_5$ is connected by a corresponding current source $I_1$–$I_5$ to ground. The input to the left hand branch of each differential pair $G_1$–$G_5$ is connected to a node N, which is connected in turn by a resistor $R_1$ having a unit resistance R to a supply voltage V. The input to the right hand branch of each differential pair $G_1$–$G_5$ is connected to a node P, which is connected in turn by a resistor $R_2$, also having a unit resistance R, to the supply voltage V. The total current through resistors $R_1$ and $R_2$, summed at nodes N and P from the individual currents through either the left hand branch or the right hand branch of each differential pair $G_1$–$G_5$, define voltages $V_{SN}$ and $V_{SP}$, respectively.

Either $V_{SN}$ or $V_{SP}$ may be employed to detect a fault state based on the values in TABLE I below:

TABLE I

| # of 1's | $V_{SN}$ | $V_{SP}$ | Status |
| --- | --- | --- | --- |
| 0 | 0 RI | 5 RI | Fault |
| 1 | 1 RI | 4 RI | Valid (3.5 RI < $V_{SP}$ < 4.5 RI) |
| 2 | 2 RI | 3 RI | Fault |
| 3 | 3 RI | 2 RI | Fault |
| 4 | 4 RI | 1 RI | Fault |
| 5 | 5 RI | 0 RI | Fault | where RI corresponds to a unit current I (driven by each of current sources $I_1$–$I_6$) through a unit resistance R. The exemplary embodiment utilizes $V_{SP}$, for which the valid condition is $V_{SP}$=4 RI, while the neighboring invalid states are $V_{SP}$=3 RI and $V_{SP}$=5 RI. Therefore the boundary conditions for the valid states are set as 3.5 RI<$V_{SP}$<4.5 RI.

Detector 200 determines whether the output for ring counter 400 falls within the boundary conditions with resistors $R_3$ and $R_4$ and integrating comparators C1 and C2. Resistors $R_3$ and $R_4$ are connected in series between the supply voltage V and a unit current source I6 connected to ground, with resistor $R_3$ having a resistance of 3.5 times the unit resistance R and resistor $R_4$ having the unit resistance R. Voltage $V_{SP}$ is received at the negative input to comparator $C_1$ and the positive input to comparator $C_2$, and is compared respectively to a voltage of 3.5 RI, generated by the unit current from current source $I_6$ through resistor $R_3$, and a voltage of 4.5 RI, generated from the unit current from current source $I_6$ through the combined resistances of resistors $R_3$ and $R_4$. The outputs of comparators C1 and C2 are logically combined to produce a fault state output signal indicating whether $V_{SP}$ is greater than 3.5 RI and less than 4.5 RI.

Differential, low swing, current mode logic (CML) fault state detector 201 employs essentially the same construction as detector 200. In the differential case, however, the five phases of clocks $\Phi_1$–$\Phi_5$ are low-swing differential signals from a differential ring counter-based divide-by-5 clock frequency divider and the valid condition is $V_S = V_{SP} - V_{SN} = -3$ RI, while the neighboring invalid states are $V_S = -5$ RI and $V_S = -$RI. Possible values of $V_{SN}$, $V_{SP}$ and $V_S$ and the corresponding fault status are set forth in TABLE II below:

TABLE II

| # of 1's | $V_{SN}$ | $V_{SP}$ | $V_S = V_{SP} - V_{SN}$ | Status |
|---|---|---|---|---|
| 0 | 0 RI | 5 RI | −5 RI | Fault |
| 1 | 1 RI | 4 RI | −3 RI | Valid (−4 RI < $V_S$ < −2 RI) |
| 2 | 2 RI | 3 RI | −RI | Fault |
| 3 | 3 RI | 2 RI | RI | Fault |
| 4 | 4 RI | 1 RI | 3 RI | Fault |
| 5 | 5 RI | 0 RI | 5 RI | Fault |

Therefore, the boundary conditions for the valid states are set as $-4$ RI $< V_S < -2$ RI.

Based on those boundary conditions, resistors $R_3$ and $R_4$ in detector 200 are replaced in detector 201 with resistors $R_5$ and $R_6$ each having twice the unit resistance. Differential comparators $DC_1$ and $DC_2$ are employed, with comparator $DC_1$ receiving the supply voltage V and voltage $V_{SN}$ as well as the voltage $V_{SP}$ and the voltage below resistance $R_5$, and comparator DC2 also receiving the supply voltage V and voltage $V_{SN}$ together with the voltage $V_{SP}$ and the voltage below resistance $R_6$.

Fault state detectors 200 and 201 have no mismatched load capacitances. Therefore a precise 1/N duty ratio is guaranteed by the sampling edge of the input clock. Furthermore, since only DC values are of interest, the sampling transistors in the fault detection circuit may be made very small, resulting in low load capacitance and allowing a high operating frequency to be achieved at low power consumption. The present invention is applicable to all semiconductor integrated circuit processes, such as rail-to-rail swing digital complementary metal-oxide-semi-conductor (CMOS) logic, low-voltage swing differential current steering CMOS logic, silicon bipolar junction transistor (BJT) and/or bipolar CMOS (BiCMOS) logic, silicon germanium heterojunction bipolar junction transistor (SiGe HBT) logic, etc.

FIGS. 3A through 3F depict transient simulations for a differential fault detector in a divide-by-5, ring counter-based clock frequency divider according to one embodiment of the present invention. The first five traces in each figure represent signals for a different number of 1's within the ring counter; the sixth trace in each figure plots the resulting value of voltage $V_s$ relative to the boundary conditions; the seventh trace in each figure depicts the comparator outputs; and the last trace in each figure depicts the fault state output signal from the comparator. FIG. 2A illustrates simulation results for a fault due to all zeros. FIG. 2B illustrates simulation results for a valid state. FIGS. 2C through 2F illustrate simulation results for, respectively, two through five 1's within the ring counter.

When an N-bit ring counter is employed as a divide-by-N frequency divider to generate non-overlapping N phases of divide-by=N clocks each with 1/N duty ratio, with exactly 1 bit turned on at all times, fault states may be detected based on the average DC voltage of the outputs from the ring counter, which is proportional to the number of 1's in the ring. By sampling the average DC voltage of the ring counter outputs for comparison to two boundary reference voltages, fault states may be flagged. Load capacitance from such a fault state detection circuit remains low and balanced, allowing a high operating frequency to be achieved at low power consumption.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A fault state detector comprising:
    a network of transistors generating at least one signal proportional to a number of asserted outputs for a ring counter; and
    one or more comparators comparing the at least one signal to boundary reference values for the at least one signal, the one or more comparators determining a fault when the at least one signal is not between the boundary reference values.

2. The fault state detector according to claim 1, wherein the network of transistors switch a unit current through unit resistance for each asserted output for the ring counter, a sum of unit currents switched by the network of transistors comprising the at least one signal.

3. The fault state detector according to claim 2, wherein the network of transistors further comprise:
    N differential pairs each switched by one of N phase non-overlapping output signals from the ring counter, where N is a positive non-zero integer.

4. The fault state detector according to claim 1, wherein the one or more comparators further comprise:
    a first comparator comparing the at least one signal to an upper boundary reference value; and
    a second comparator comparing the at least one signal to a lower boundary reference value.

5. The fault state detector according to claim 4, wherein the first and second comparators are single ended comparators each coupled at one input to one transistor within one of a plurality of differential pairs.

6. The fault state detector according to claim 4, wherein the first and second comparators are differential comparators each coupled at each of two inputs to a different transistor within one of a plurality of differential pairs.

7. The fault state detector according to claim 4, wherein outputs of the first and second comparators are logically combined to indicate a fault state.

8. An interface circuit including the fault state detector according to claim 1, the interface circuit further comprising:
    a clock divider generating N phases of non-overlapping clocks; and
    a multiplexer receiving the N phases of non-overlapping clocks as selects, the multiplexer switching N multiplexer input signals to a multiplexer output based on the N phases of non-overlapping clocks.

9. A data processing system including the interface circuit according to claim 8, the data processing system further comprising:
    a set of inputs receiving N parallel input signals; and
    an output transmitting serialized data from the N parallel input signals.

10. A method of fault state detection comprising:

generating at least one signal proportional to a number of asserted outputs for a ring counter; and comparing the at least one signal to boundary reference values for the at least one signal to determine a fault when the at least one signal is not between the boundary reference values.

11. The method according to claim 10, wherein a network of transistors generating the at least one signal switch a unit current through unit resistance for each asserted output for the ring counter, a sum of unit currents switched by the network of transistors comprising the at least one signal.

12. The method according to claim 11, wherein the network of transistors further comprise:

N differential pairs each switched by one of N phase non-overlapping output signals from the ring counter, where N is a positive non-zero integer.

13. The method according to claim 10, wherein one or more comparators comparing the at least one signal to the boundary reference values further comprise:

a first comparator comparing the at least one signal to an upper boundary reference value; and a second comparator comparing the at least one signal to a lower boundary reference value.

14. The method according to claim 13, wherein the first and second comparators are single ended comparators each coupled at one input to one transistor within one of a plurality of differential pairs.

15. The method according to claim 13, wherein the first and second comparators are differential comparators each coupled at each of two inputs to a different transistor within one of a plurality of differential pairs.

16. A fault state detector comprising:

N differential pairs each coupled an output for a ring counter and switching a unit current through a unit resistance if a respective output for the ring counter is asserted;

at least one summing node receiving currents switched by the differential pairs; and one or more comparators comparing a cumulative current through each summing node to boundary reference values, the one or more comparators determining a fault when the at least one signal is not between the boundary reference values.

17. The fault state detector according to claim 16, wherein the at least one summing node further comprises:

first and second summing nodes each connected to a different transistor within each of the N differential pairs.

18. The fault state detector according to claim 16, wherein one or more comparators comparing the at least one signal to the boundary reference values further comprise:

a first comparator comparing the at least one signal to an upper boundary reference value; and a second comparator comparing the at least one signal to a lower boundary reference value.

19. The fault state detector according to claim 16, wherein the first and second comparators are single ended comparators each coupled at one input to one transistor within one of a plurality of differential pairs.

20. The fault state detector according to claim 16, wherein the first and second comparators are differential comparators each coupled at each of two inputs to a different transistor within one of a plurality of differential pairs.

* * * * *